(12) United States Patent
Huang et al.

(10) Patent No.: US 6,168,449 B1
(45) Date of Patent: Jan. 2, 2001

(54) TEST SOCKETS FOR INTEGRATED CIRCUITS

(75) Inventors: Hsiang-Yu Huang; Ta-Chou Huang; Yuh-Wen Huang; Gau-Ching Day; Rong-Fang Horng, all of Tainan (TW)

(73) Assignee: Industrial Technology Research Institute (TW)

( * ) Notice: Under 35 U.S.C. 154(b), the term of this patent shall be extended for 0 days.

(21) Appl. No.: 09/359,316

(22) Filed: Jul. 23, 1999

(30) Foreign Application Priority Data

Feb. 24, 1999 (TW) ................................................ 88202849

(51) Int. Cl.[7] .................................................... H01R 13/15
(52) U.S. Cl. ............................................ 439/259; 439/266
(58) Field of Search ................................... 439/259, 263, 439/264, 266, 342

(56) References Cited

U.S. PATENT DOCUMENTS

| | | |
|---|---|---|
| 5,556,293 | 9/1996 | Pfaff . |
| 5,578,870 | 11/1996 | Farnsworth . |
| 6,036,503 * | 3/2000 | Tsuchida ............................. 439/700 |
| 6,050,836 * | 4/2000 | Tohyama .............................. 439/266 |

* cited by examiner

Primary Examiner—Khiem Nguyen
(74) Attorney, Agent, or Firm—Dykema Gossett PLLC

(57) ABSTRACT

A test socket for an integrated circuit includes a frame body, a number of electrical contacts, two sliding plates, a mechanism for slidingly moving the sliding plates in a horizontal direction, and two elastic elements. When applying a force to the mechanism, the sliding plates slide away from each other to make each ball contact of a ball grid array integrated circuit move downwardly into an associated through-hole of the sliding plate. When the force is removed, returning forces provided by the elastic elements return the sliding plates to their close contact status, and each ball contact is born against by an associated electrical contact and thus retained in the associated through-hole of the sliding plate such that signals from the ball contacts can be outputted via the electrical contacts.

14 Claims, 7 Drawing Sheets

TEST SOCKETS FOR INTEGRATED CIRCUITS

BACKGROUND OF THE INVENTION

1. Field of the Invention

The present invention relates to test sockets for high pin count integrated circuit packages, and more particularly to test and burn in sockets for ball grid array integrated circuit packages.

2. Description of the Related Art

Surface mounted, high pin count integrated circuit packages have been dominated by quad flat packs (QFPS) with various pin configurations. These packages have closely spaced leads for making electrical connections distributed along four edges of the flat packages. These packages have become limited by being confined to the edges of the flat pack even through the spacing between the pins is small.

A new package, a ball grid array (BGA) has been adopted to meet the requirement of high pin count, in which the electrical contact points are distributed over the entire bottom surface of the packages to overcome the problem of insufficient space in the edges for the pins. More contact points can be located with greater spacing than with the QFPS. These contacts are solder balls that facilitate flow soldering of the packages onto a printed circuit board. Thus, BGA's are popular than QFP's.

Sockets that accept BGA's are necessary for testing, burn-in, re-programming, and sometimes for production use where the integrated circuit may need replacing. Several such sockets have been developed to satisfy this need, and most of them are of a clam shell design, wherein a hinged top opens to allow package entry, and closing the top retains the package within the socket. The socket includes a bed of contacts spaced to match the BGA contacts and a spring load is arranged to press the package onto the bed of contracts to ensure electrical connections. It is, however, found that the socket contacts place forces onto the IC contacts in the same direction. This force drives one side of the package against an abutment of the socket. With a large number of contacts this cumulative force of many spring loaded contacts is very large and may physically damage the package.

U.S. Pat. No. 5,578,870 to Farnsworth et al. on Nov. 26, 1996 discloses a top loading test socket for ball grid arrays. In said patent, a movable plate is used. The ball contacts are lowered into through-holes in the plate when applying a force to a lever arm to move the plate. A spring means returns the plate to its initial position after the force is removed, such that the electrical contacts that extend through the through-holes of the plate are lowered to bear against the ball contacts to thereby retain the BGA IC in place. In such an improved arrangement, each ball contact is born by a corresponding electrical contact in the same direction, while the other side of the ball contact bears against an edge of the corresponding hole. It is, however, found that the BGA IC is ejected out of the test socket as a result of being subjected to uneven forces if the ball contacts bear the corresponding holes in different relative points (see FIG. 1 of the drawings). In addition, the electrical contacts bear against the ball contacts and thus tend to be damaged in the bearing points after a long-term use.

U.S. Pat. No. 5,556,293 to Pfaff issued on Sep. 17, 1996 discloses a mounting apparatus for ball grid array device that also uses a plate movable in a direction identical to that disclosed by U.S. Pat. No. 5,578,870. Accordingly, the ejection problem of the IC out of the test socket as a result of uneven forces is inevitable.

The present invention is intended to provide improved test sockets for integrated circuits that mitigates and/or obviates the above problem.

SUMMARY OF THE INVENTION

In view of the problem of the prior art, it is a primary object of the present invention to provide a test socket for a ball grid array integrated circuit that is subjected two symmetric forces on both sides, thereby avoiding ejection of the integrated circuit out of the test socket as a result of uneven forces.

It is another object of the present invention to provide electrical contacts that are in arcuate surface contact with the ball contacts to avoid damage to the ball contacts.

It is a further object of the present invention to provide a test socket that allows easy insertion and extraction of the integrated circuit.

In order to achieve the above objects, the conventional test socket has been improved by the present invention such that the sliding plate of the conventional test socket is replaced by two symmetric sliding plates, and two elastic elements are symmetrically disposed to two opposite sides of the sliding plates. By means of provision of the mechanism arranged in the upper lid and the sliding plates, the sliding plates slide horizontally away from each other when the upper lid is subjected to a downward force. The elastic elements provide returning forces after the downward force is removed. In addition, the electrical contact is designed to have a curved section. The lower section of each electrical contact is inserted into the frame body that acts as a base, and the upper curved section of each electrical contact bears against an inner periphery of an associated through-hole of the sliding plate. The upper end of the curved section is arcuate to mate with the ball contact.

When the sliding plates move away from each other as a result of an external force, upper ends of the electrical contacts are displaced by the sliding plates such that the arcuate section of each electrical contact and the inner periphery of the associated through-hole of the sliding plates together defines a space for receiving an associated ball contact. The ball contact moves downwardly along with the integrated circuit to be tested. The external force is then removed to return the sliding plates to their close contact status, while the arcuate section of the upper end of each electrical contact contacts the associated ball contact. Since the sliding plates are symmetrically arranged, the left half electrical contacts and the right half electrical contacts bear against left sides and right sides of the associated ball contacts, respectively. Thus, the integrated circuit to be tested is subjected to even forces to thereby avoid the problem of ejection of the integrated circuit out of the test socket as a result of uneven forces in the prior art.

In addition, the upper lid includes an opening having a size the same as that of the integrated circuit to be tested to allow convenient insertion and extraction of the integrated circuit and to restrain horizontal movement of the integrated circuit.

Other objects, advantages, and novel features of the invention will become more apparent from the following detailed description when taken in conjunction with the accompanying drawings.

BRIEF DESCRIPTION OF THE DRAWINGS

FIG. 3b is a sectional view of the test socket in FIG. 3a;

FIG. 4b is a sectional view of the test socket in FIG. 4a;

FIG. 5b is a sectional view of the test socket in FIG. 5a;

DETAILED DESCRIPTION OF THE PREFERRED EMBODIMENTS

Figure 1:
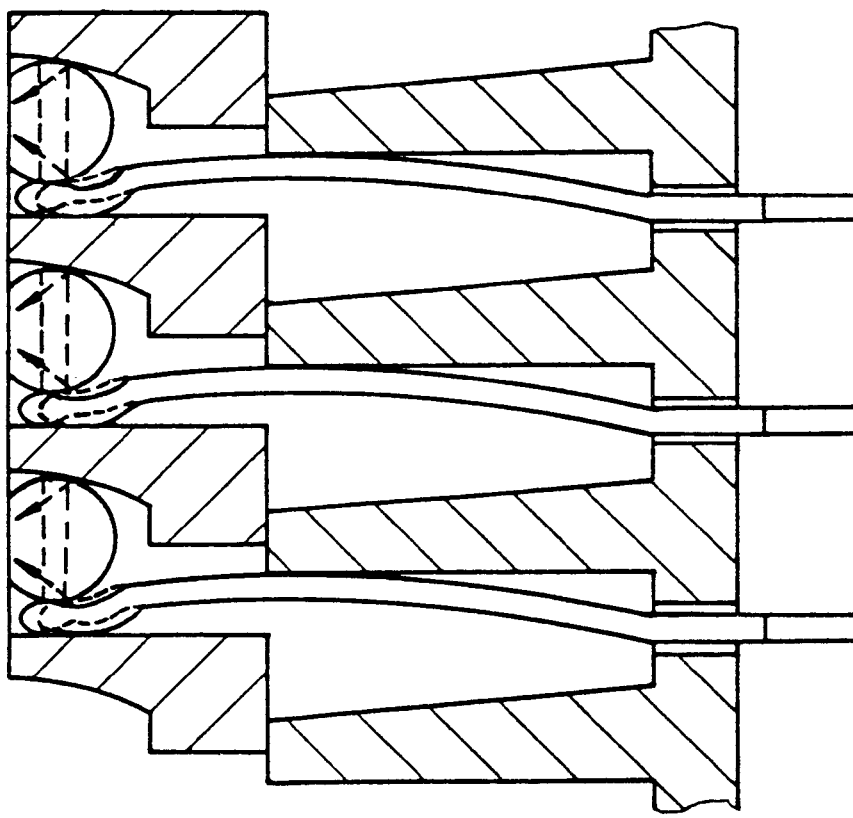
FIG. 1 is a schematic sectional view illustrating uneven forces acting on an integrated circuit in a test socket according to prior art.
Figure 2:
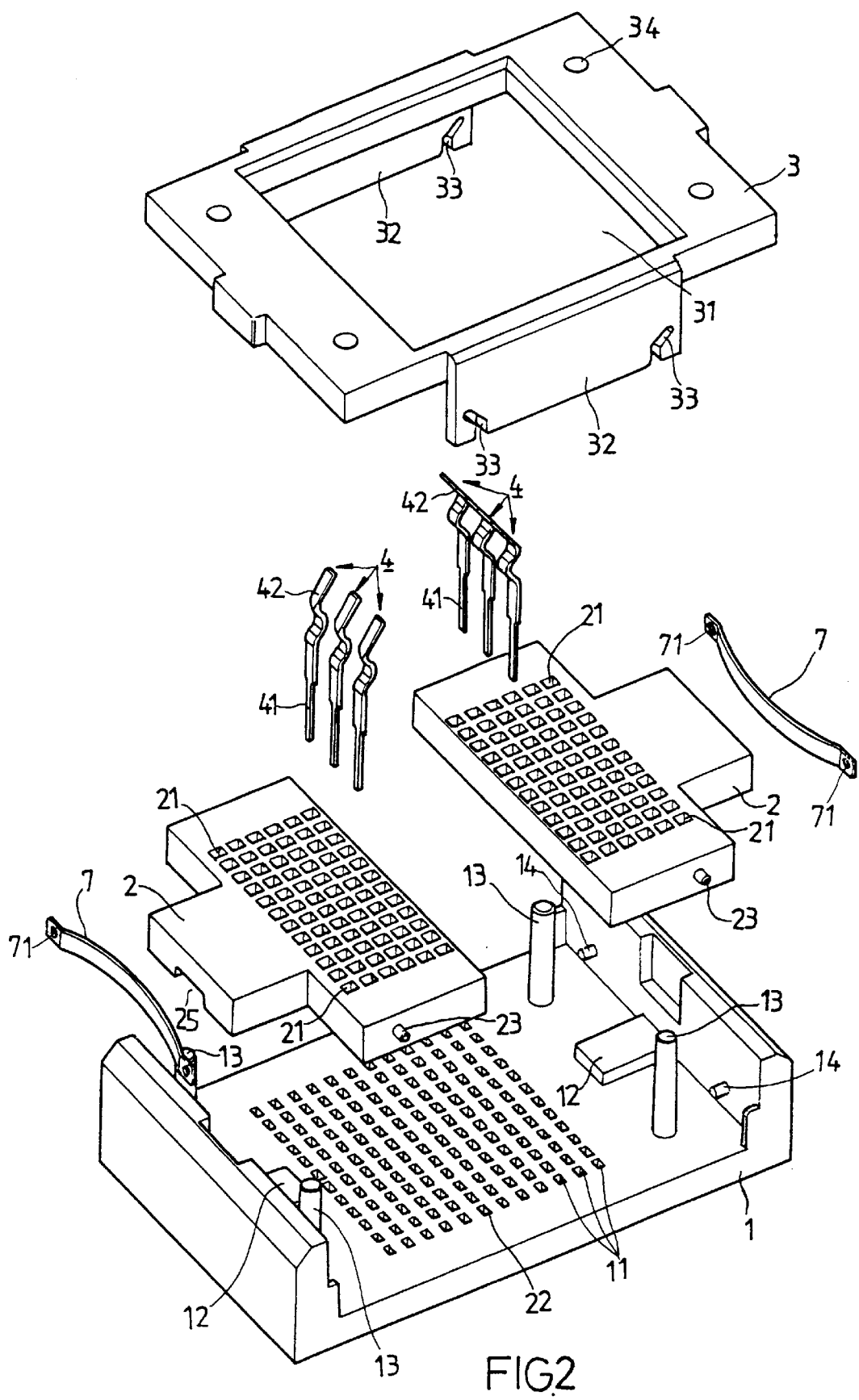
FIG. 2 is an exploded perspective view of a test socket for integrated circuits in accordance with the present invention.

Referring to FIG. 2, a preferred embodiment of a test socket in accordance with the present invention generally includes a frame body 1, two sliding plates 2, an upper lid 3, a plurality of electrical contacts 4, and two elastic elements 7.

The frame body 1 is substantially a base having a plurality of insertion holes 11 defined therein, two fixed slide guide pieces 12, and four posts 13. Each insertion hole 11 is located corresponding to a ball contact 6 (FIG. 3b) of a ball grid array integrated circuit (BGA IC) (not shown in FIG. 2).

The sliding plates 2 are mounted on top of the frame body 1 and each include a plurality of through-holes 21, each through-hole 11 aligning with an associated insertion hole 11 of the frame body 1. Each sliding plate 2 includes a sliding groove 25 in an underside thereof to guide sliding movement of the sliding plate 2 by the associated fixed slide guide piece 12 received in the sliding groove 25. Each sliding plate 2 further includes a sliding peg 23 on each lateral side thereof, which will be described later.

The upper lid 3 is mounted above the sliding plates 2 and includes an opening 31, two downwardly extending lateral plates 32, and four post holes 34. Each lateral plate 32 includes two sliding slots 33. The opening 31 has a size the same as that of a BGA IC such that the BGA IC may be inserted into the test socket via the opening 31 from top. Inner edges of the opening 31 restrict horizontal position of the BGA IC. Each lateral plate 32 that extends downwardly is outside the associated lateral sides of the sliding plates 2. The sliding grooves 33 in the lateral plates 32 extend toward end edges of the lateral plates 32 and respectively receive the sliding pegs 23 of the sliding plates 2 to thereby provide a mechanism for moving the sliding plates 2 horizontally and outwardly away from each other. The posts 13 of the frame body 1 extend through the post holes 34 of the upper lid 3 to guide vertical movements of the upper lid 3 relative to the frame body 1.

Each electrical contact 4 is made of conductive metal material and includes an upper section 42, a mediate section, and a lower section 41. The lower section 41 of each electrical contact 4 is inserted into and thus retained in an associated insertion hole 11 of the frame body 1. The upper section 42 of each electrical contact 4 extends through an associated through-hole 21. The electric contact 4 may be replaced when it is damaged. The upper section 42 of each of the electrical contacts in the left half of the test socket is substantially S shaped, while the upper section 42 of each of the electrical contacts in the right half of the test socket is substantially a mirror image of S.

Each elastic element 7 is mounted between the frame body 1 and an associated sliding plate 2 and includes a fixing hole 71 so as to be secured to fixing pegs 14 of the frame body 1. The elastic element 7 is made of an arcuate metal plate or any other suitable material. Alternatively, the elastic element 7 may be an elastic member of other shapes, e.g., a spring. When the sliding plates 2 moves away from each other in a horizontal direction, the elastic element 7 is compressed in its mediate portion to generate a returning force between the frame body 1 and the associated sliding plate 2.

When the upper lid 3 is subjected to a downward force, the sliding pegs 23 slide along the sliding slots 33 and thus causes the sliding plates 2 to slide away from each other in the horizontal direction under guidance of the fixed slide guide pieces 12 received in the grooves 25. The elastic elements 7 are compressed to generate the returning forces. When the downward force acting on the upper lid 3 is removed, the sliding plates 2 move toward and thus contact each other under action of the returning forces of the elastic elements 7.

Figure 3A:
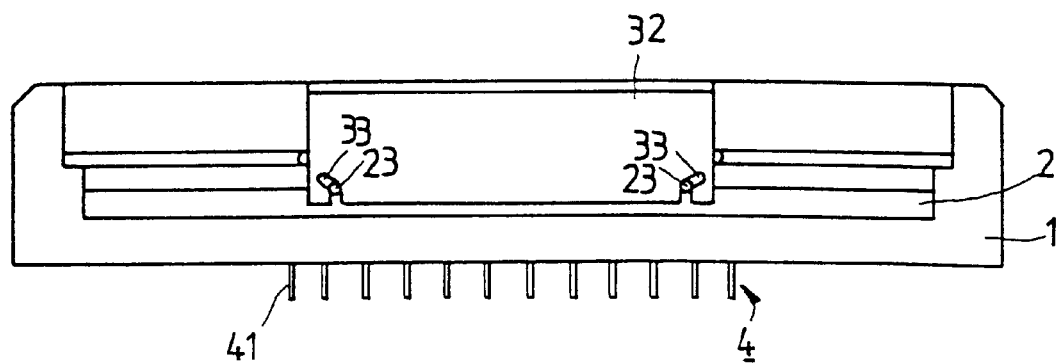
FIG. 3a is a side view of a first embodiment of the test socket before outward sliding movements of two sliding plates.
Figure 3B:
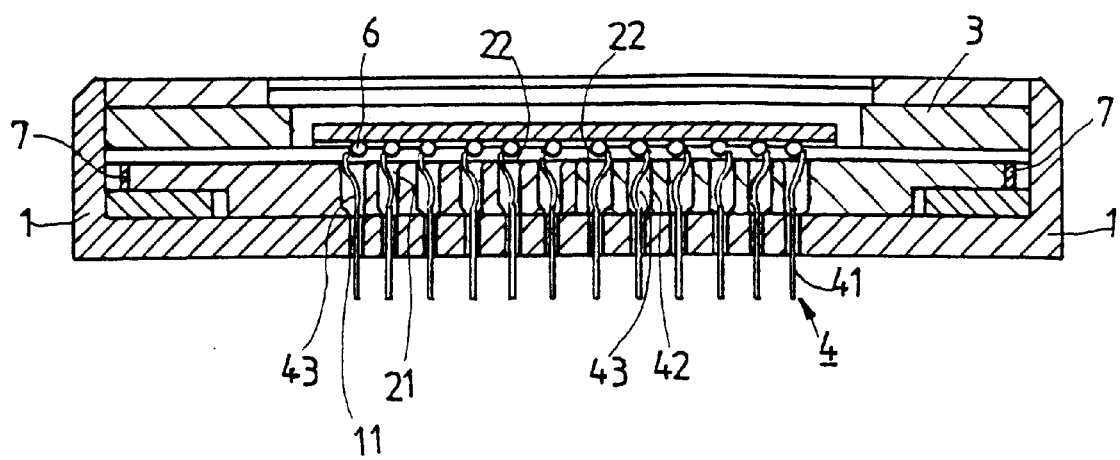

FIGS. 3a and 3b are respectively side view and sectional view of the test socket of FIG. 2 in an assembled status with an IC placed in the test socket for testing. The IC (FIG. 3b) to be tested is placed above the sliding plates 2, and the upper lid 3 is not subjected to a downward force such that each sliding peg 23 is in a lower portion of the associated sliding slot 33, as shown in FIG. 3a. The lower section 41 of each electrical contact 4 is fixed in the associated insertion hole 11 of the frame body 1, while the upper section 42 of each electrical contact 4 extends upward through the associated through hole 21 such that an upper end of the upper section 42 is in light contact with an associated ball contact 6, as shown in FIG. 3b.

Figure 4A:
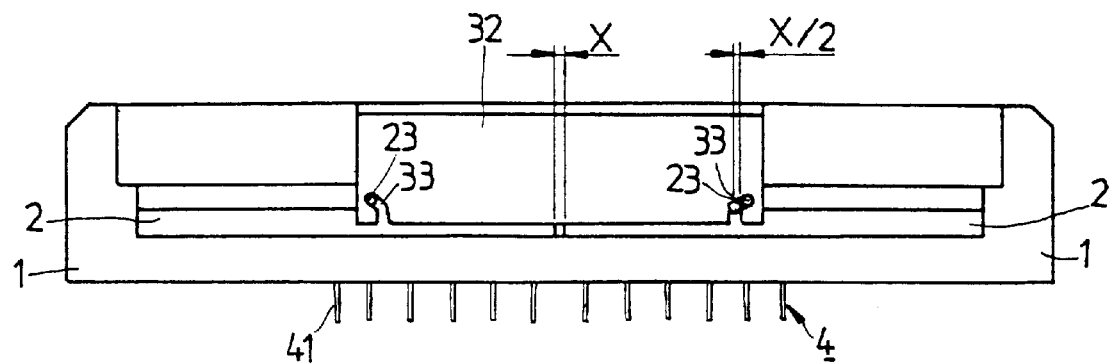
FIG. 4a is a side view of the test socket in FIG. 3, wherein the sliding plates slide outwardly away from each other.
Figure 4B:
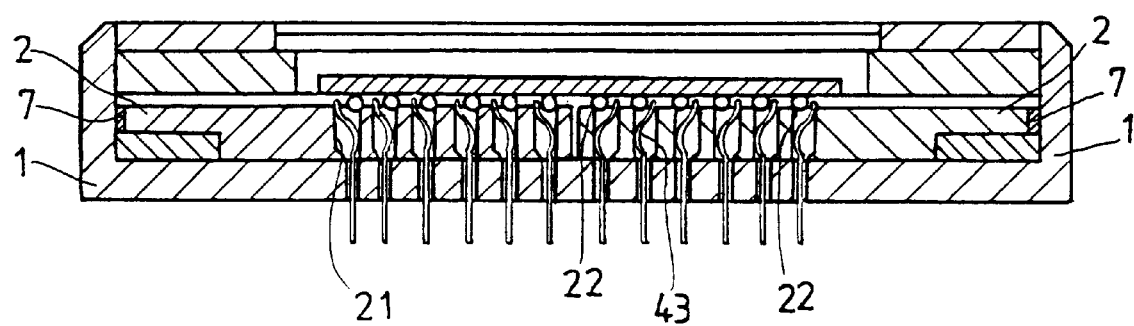

FIGS. 4a and 4b illustrate status of the test socket after applying a downward force on the upper lid 3 in FIGS. 3a and 3b. When the upper lid 3 is pressed downward, the sliding pegs 23 move along the sliding slots 33. Since the pegs 23 are fixed on the sliding plates 2 that cannot move downward, each sliding groove 33 exerts a horizontal force to the associated sliding peg 23 when the sliding peg 23 slides in the sliding groove 33, thereby moving the sliding plates 2 away from each other in the horizontal direction. As mentioned above, returning forces are generated by means of compressing the elastic elements 7 during outward movements of the sliding plates 2. At the same time, an edge of each through-hole 21 bears against a reverse bending point 43 of a lower portion of the "S" section of the associated electrical contact 4. As a result, the reverse bending point 43 and the upper portion of the "S" section of the electrical contact 4 are displaced such that a space (for receiving the ball contact 6) between the edge of the through-hole 21 and the electrical contact 4 becomes larger. Each ball contact 6 moves downwardly along with the IC to be tested and partially moves into the associated through-hole 21 of the sliding plate 2. It is appreciated that the through-hole 231 includes a chambered edge 22 to which the ball contact 6 contacts to thereby avoid damage to the ball contact 6.

Figure 5A:
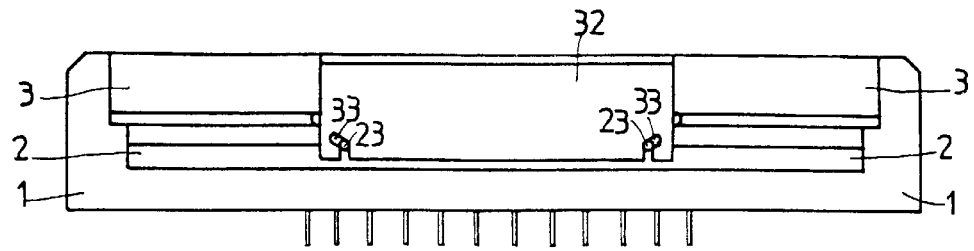
FIG. 5a is a side view of the first embodiment of the test socket, wherein the external force acting on the sliding plates has been removed.
Figure 5B:
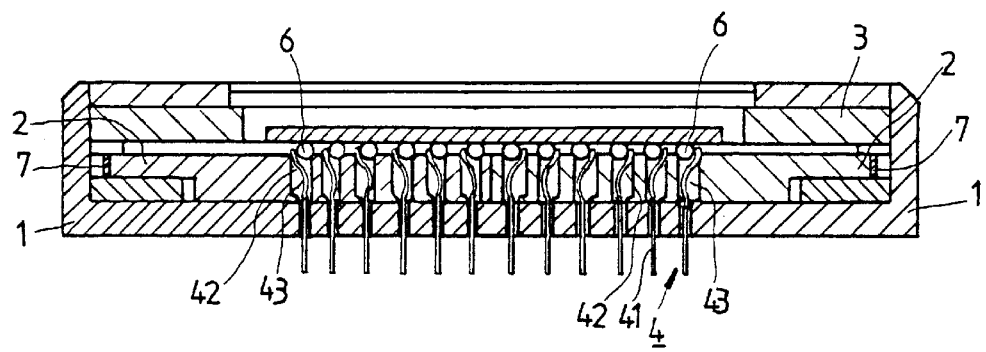
Figure 5C:
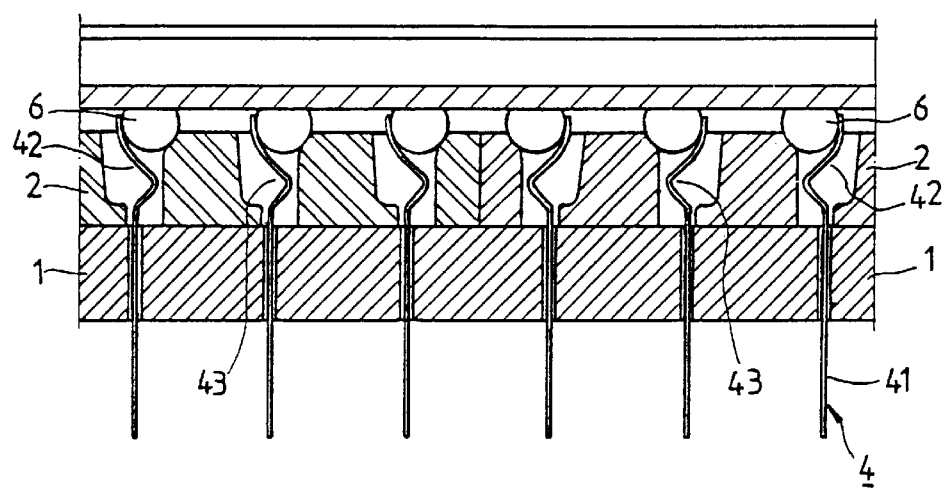
FIG. 5c is an enlarged sectional view illustrating detailed structure of a portion of the test socket and an integrated circuit in the test socket in FIG. 5b.

FIGS. 5a, 5b, and 5c illustrate status of the test socket after removing the downward force acting on the upper lid 3 in FIGS. 4a and 4b, wherein FIG. 5c is an enlarged view of a portion of FIG. 5b. When the downward force acting on the upper lid 3 is removed, as mentioned above, the elastic elements 7 provide returning forces to return the sliding plates 2. Thus, the sliding plates 2 carrying the sliding pegs 23 return to positions shown in FIG. 3a, and the upper lid 3 is moved to an initial position before applying the downward force, as shown in FIG. 5a.

When the sliding plates 2 return to contact each other, the edge of the through-hole 21 no longer bears against the reverse bending point 43 of the electrical contact 4. As a result, the upper end of the electrical contact 4 springs to its initial position to contact the associated ball contact 6. In this case, the arcuate upper end of the electrical contact 4 bears against a side of the ball contact 6 to thereby retain the IC to be tested in place. Since the "S" section of each electrical contact 4 in the through-holes 21 of one of the sliding plates 2 and the section of mirror image of "S" of each electrical contact 4 in the through-holes 21 in the other sliding plate 2 bear against left side and right side of the associated ball contacts 4, respectively, the overall resultant force acting on the electrical contacts 4 of the IC to be tested is zero. Thus, the ejection problem of the IC out of the test socket as a result of uneven forces is avoided.

After testing, the upper lid 3 is pressed downward again to make the electrical contacts 4 and the ball contacts 6 in a status shown in FIG. 4b. Then, an extraction means (not shown) is used to extract the IC from the test socket.

Figure 6A:
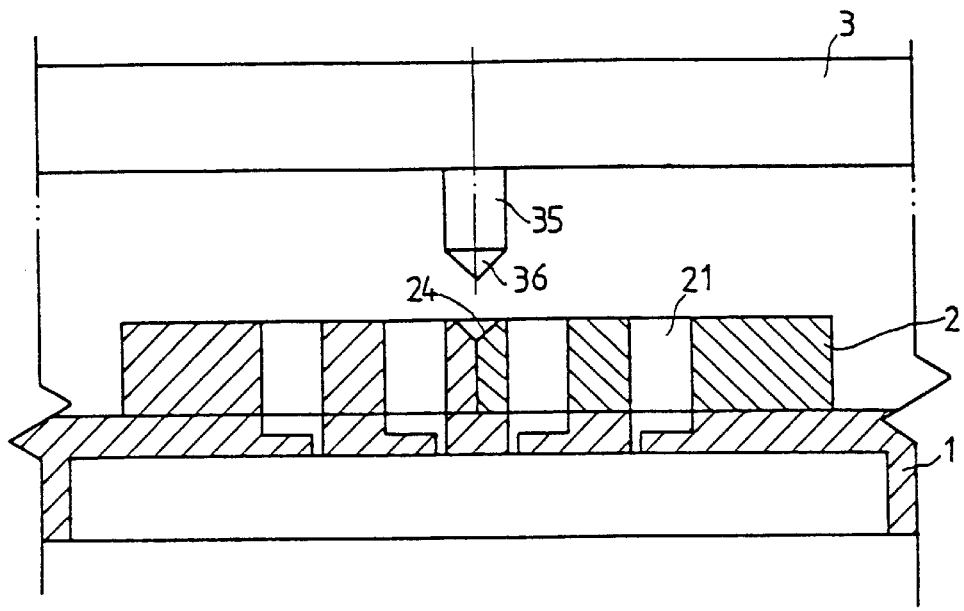
FIG. 6a is a sectional view of a second embodiment of the test socket before outward sliding movements of the sliding plates.
Figure 6B:
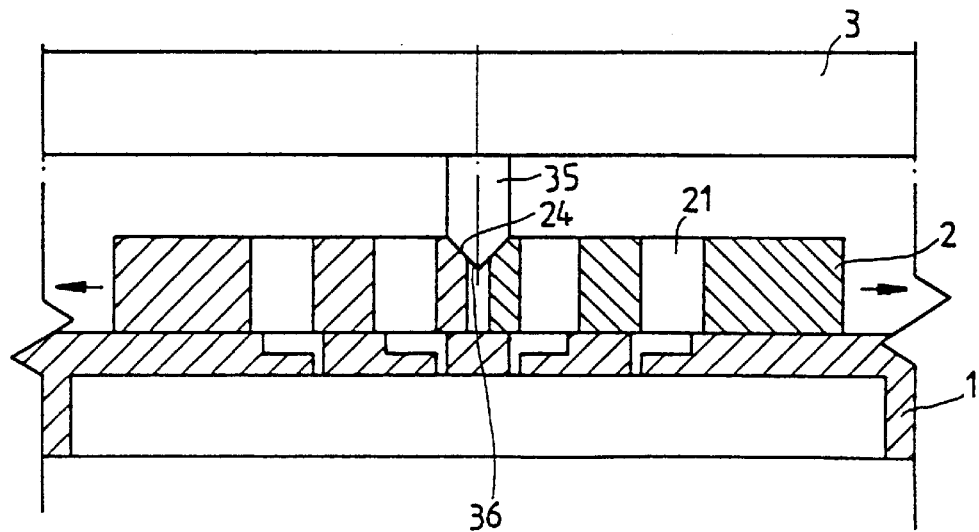
FIG. 6b is a sectional view similar to FIG. 6a, wherein the sliding plates slide outwardly away from each other.

FIGS. 6a and 6b illustrate a second embodiment of the test socket in accordance with the present invention. The second embodiment is identical to the first embodiment, except for that the sliding grooves 33 of the upper lid 3 and the sliding pegs 23 of the sliding plates 2 have been replaced by a push rod 35 and an operative inclined surface 24 on each sliding plate 2. The push rod 35 is mounted to an underside of the upper lid 3 and includes a conic face 36. Each operative inclined surface 24 is defined in an upper edge of the sliding plate. The operative inclined surfaces 24 together define a conic hole when the sliding plates 2 contact each other. The conic face 36 and the operative inclined surfaces 24 may be of other complimentarily formed inclined surfaces, e.g. the conic face 36 may be a wedge, and the operative inclined surfaces 24 may be inclined grooves.

The push rod 35 is located above the operative inclined surfaces 24, in which the conic face 36 does not contact the operative inclined surfaces 24 before the upper lid 3 is subjected to a downward force, as shown in FIG. 6a. When the upper lid 3 is subjected to a downward force, the push rod 35 moves downward into the conic hole defined by the operative inclined surfaces 24. Then, the conic face 36 bears against the operative inclined surfaces 24 and thus exerts a horizontal force to move the sliding plates 2 away from each other, as shown in FIG. 6b.

Figure 7A:
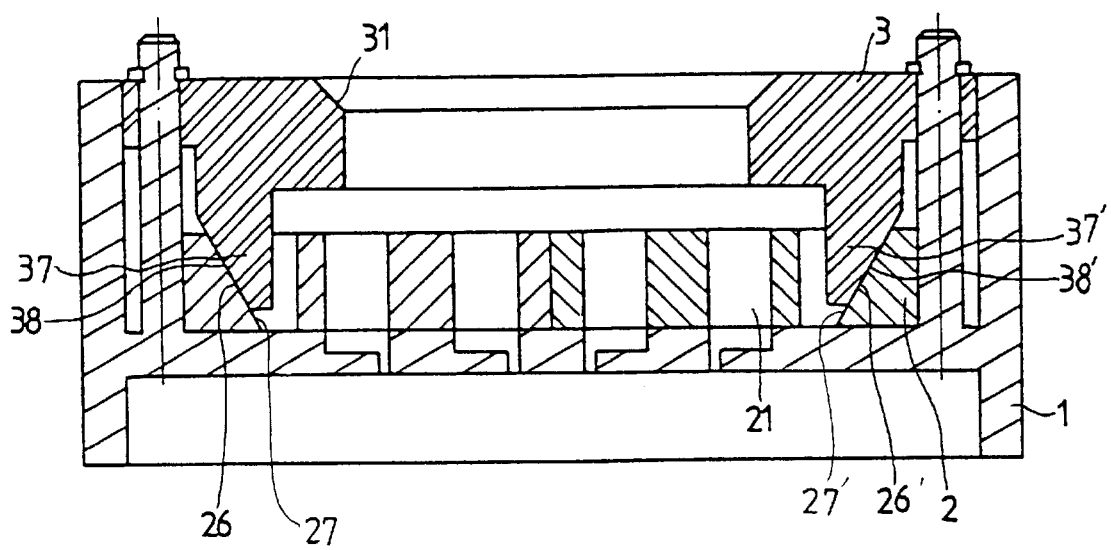
FIG. 7a is a sectional view of a third embodiment of the test socket before outward sliding movements of the sliding plates.
Figure 7B:
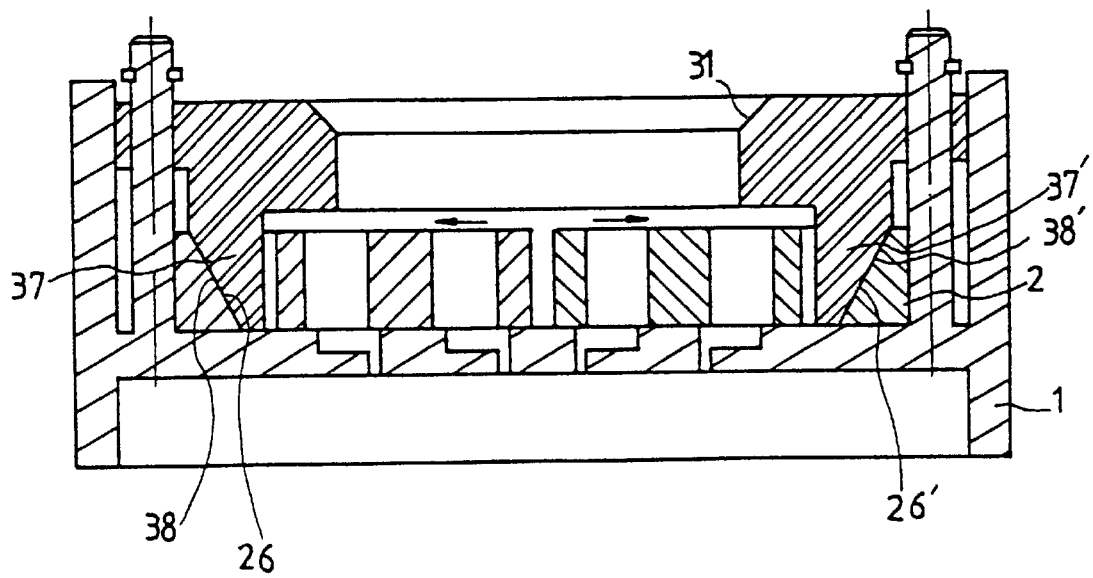
FIG. 7b is a sectional view similar to FIG. 7a, wherein the sliding plates slide outwardly away from each other.

FIGS. 7a and 7b illustrate a third embodiment of the test socket in accordance with the present invention. The third embodiment is identical to the first embodiment and the second embodiment, except for that the mechanism for causing outward horizontal movements of the sliding plates 2 have been replaced by two inclined pins 37 and 37' on the upper lid 3 and two receiving holes 26 and 26' in the sliding plates 2. The inclined pins 37 and 37' are located on two sides of the upper lid 3, respectively. Each inclined pin 37, 37' includes an operative inclined surface 38, 38'. The receiving holes 26 and 26' are defined in opposite sides of the sliding plates 2, respectively. Each receiving hole 26, 26' includes an operative inclined surface 27, 27' to cooperate with an associated operative inclined surface 38, 38'.

Before the upper lid 3 is subjected to a downward force, the pin 37, 37' is partially extended into the associated receiving hole 26, 26' such that the operative inclined surface 38, 38' contacts the operative inclined surface 27, 27', as shown in FIG. 7a. When the upper lid 3 is subjected to a downward force, the operative inclined surface 38 and 38' slides along the operative inclined surface 27, 27' to provide a horizontal force for moving the sliding plates 2 away from each other, as shown in FIG. 7b.

According to the above description, it is appreciated that the present invention provides two separate sliding plates 2 that can be moved horizontally away from each other by means of sliding mechanism provided between the upper lid 3 and the sliding plates 2 when applying a downward force to the upper lid 3. The forces acting on the BGA IC are symmetric such that the resultant force is zero to avoid uneven single-direction forces acting on the BGA IC in the conventional test socket design that might eject the BGA IC.

Although the invention has been explained in relation to its preferred embodiment, it is to be understood that many other possible modifications and variations can be made without departing from the spirit and scope of the invention as hereinafter claimed.

What is claimed is:

1. A test socket for an integrated circuit with a plurality of ball contacts, the test socket comprising:

a frame body including a plurality of first through-holes and an upper side with two ends, each said first through-hole being located corresponding to an associated said ball contact of the integrated circuit to be tested;

two sliding plates mounted to the two ends of the upper side of the frame body, respectively and slidable along a horizontal direction of the frame body, each said sliding plate including a plurality of second through-holes, each said second through-hole being located corresponding to the associated said ball contact of the integrated circuit to be tested;

a plurality of electrical contacts each mounted in an associated said first through-hole of the frame body and an associated said second through-hole of the sliding plates for connecting with the associated said ball contact of the integrated circuit;

a mechanism mounted above the sliding plates for applying a force to the sliding plates to thereby cause the sliding plates to move horizontally away from each other, such that an open space is defined between an inner periphery that defines the associated second through-hole and an upper section of the associated electrical contact to allow the associated ball contact to enter said open space; and at least two elastic elements each mounted between the frame body and an associated said sliding plate, each said elastic element generating a returning force when the sliding plates are moved away from each other for returning the sliding plates that have been moved apart;

whereby the integrated circuit to be tested is placed above the sliding plates, and the mechanism is applied with a downward force to slidingly move the sliding plates away from each other, such that the associated ball contact is lowered into the open space between the inner periphery of the associated second through-hole and the upper section of the associated electrical contact, and when the force is removed, the returning forces provided by said at least two elastic elements return the sliding plates and close the open space to make the associated electrical contact extended through the associated second through-hole bear against a side of the associated ball contact.

2. The test socket for an integrated circuit as claimed in claim 1, wherein the frame body includes a plurality of fixing pegs to which said at least two elastic elements are securely attached.

3. The test socket for an integrated circuit as claimed in claim 2, wherein each said elastic element is an arcuate metal plate.

4. The test socket for an integrated circuit as claimed in claim 1, wherein each said elastic element is a resilient metal plate.

5. The test socket for an integrated circuit as claimed in claim 1, wherein each said elastic element is a spring.

6. The test socket for an integrated circuit as claimed in claim 1, wherein the second through-hole in the sliding plate includes a chamfered edge in an upper portion thereof, and the ball contact contacts the chamfered edge of the upper portion of the second through-hole.

7. The test socket for an integrated circuit as claimed in claim 1, wherein the electrical contact is made of conductive metal material.

8. The test socket for an integrated circuit as claimed in claim 1, wherein the electrical contact includes a curved upper section that is born against by the inner periphery that defines the associated second through-hole, such that the upper end of the electrical contact is displaced to form the open space between the inner periphery of the associated second through-hole and the upper section of the associated electrical contact.

9. The test socket for an integrated circuit as claimed in claim 6, wherein the curved upper section of the electrical contact is configured to mate with a shape of the associated ball contact, such that the associated ball contact bears against an arcuate face when the open space is closed.

10. The test socket for an integrated circuit as claimed in claim 1, wherein the mechanism includes an upper lid and at least one push member, wherein the upper lid provides a plane to which the downward force is applied, and said at least one push member converts the downward force into horizontal forces to horizontally separate the sliding plates away from each other.

11. The test socket for an integrated circuit as claimed in claim 10, wherein said at least one push member includes two inclined sliding slots in the upper lid, and each said sliding plate includes a sliding peg slidably received in an associated said inclined sliding slot, such that when the upper lid is subjected to the downward force, the inclined sliding slots convert the downward force into the horizontal forces to thereby horizontally separate the sliding plates away from each other.

12. The test socket for an integrated circuit as claimed in claim 10, wherein the push member is a push rod mounted to a center of an underside of the upper lid, and each said sliding plate includes an operative inclined surface in an upper edge thereof, the operative inclined surfaces of the sliding plates cooperating with the push rod to convert the downward force into the horizontal forces to thereby horizontally separate the sliding plates away from each other.

13. The test socket for an integrated circuit as claimed in claim 10, wherein the push member includes two inclined pins on two sides of the upper lid, respectively, and the sliding plates include two receiving holes in two opposite ends thereof for receiving the inclined pins, each said receiving hole having an inclined surface contacted with the associated inclined pin to convert the downward force into the horizontal forces to thereby horizontally separate the sliding plates away from each other.

14. The test socket for an integrated circuit as claimed in claim 10, wherein the upper lid includes an opening having a size the same as that of a ball grid array integrated circuit.

\* \* \* \* \*